United States Patent
Shin et al.

(10) Patent No.: US 9,281,499 B2
(45) Date of Patent: Mar. 8, 2016

(54) ORGANIC LIGHT EMITTING DIODE DISPLAY DEVICE AND METHOD OF FABRICATING THE SAME

(71) Applicant: LG Display Co., Ltd., Seoul (KR)

(72) Inventors: Young-Hoon Shin, Paju-si (KR); Myung-Seop Kim, Goyang-si (KR); Jun-Ho Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/087,379

(22) Filed: Nov. 22, 2013

(65) Prior Publication Data

US 2014/0167008 A1    Jun. 19, 2014

(30) Foreign Application Priority Data

Dec. 14, 2012 (KR) .................. 10-2012-0146781

(51) Int. Cl.
*H01L 29/08*    (2006.01)
*H01L 35/24*    (2006.01)
*H01L 51/00*    (2006.01)
*H01L 51/52*    (2006.01)
*H01L 27/32*    (2006.01)

(52) U.S. Cl.
CPC ......... *H01L 51/5253* (2013.01); *H01L 27/3244* (2013.01); *H01L 27/3262* (2013.01); *H01L 51/524* (2013.01)

(58) Field of Classification Search
USPC .................. 257/40; 438/23, 34, 46
See application file for complete search history.

(56) References Cited

U.S. PATENT DOCUMENTS

| | | | | |
|---|---|---|---|---|
| 6,933,529 B2 * | 8/2005 | Yoo et al. | ......................... | 257/59 |
| 7,786,669 B2 * | 8/2010 | Park | ............................ | 313/506 |
| 8,018,143 B2 * | 9/2011 | Lee et al. | ..................... | 313/504 |
| 8,362,687 B2 * | 1/2013 | Park | ............................ | 313/503 |
| 2004/0142502 A1 * | 7/2004 | Yoo et al. | ........................ | 438/24 |
| 2007/0117257 A1 * | 5/2007 | Kim et al. | ........................ | 438/99 |
| 2007/0132374 A1 * | 6/2007 | Park | ............................ | 313/504 |
| 2007/0152222 A1 * | 7/2007 | Joo | ................................ | 257/72 |
| 2010/0001633 A1 * | 1/2010 | Lee et al. | ..................... | 313/504 |
| 2010/0320469 A1 * | 12/2010 | Park | ............................ | 257/59 |
| 2014/0070174 A1 * | 3/2014 | Kwon et al. | ................... | 257/40 |
| 2014/0138651 A1 * | 5/2014 | Oh | ................................ | 257/40 |
| 2014/0139102 A1 * | 5/2014 | Jeon et al. | ..................... | 313/504 |
| 2014/0145157 A1 * | 5/2014 | Kim et al. | ........................ | 257/40 |
| 2014/0145158 A1 * | 5/2014 | Choi et al. | ..................... | 257/40 |
| 2014/0147950 A1 * | 5/2014 | Choi et al. | ..................... | 438/46 |
| 2014/0175394 A1 * | 6/2014 | Kum et al. | ..................... | 257/40 |

* cited by examiner

*Primary Examiner* — Telly Green
(74) *Attorney, Agent, or Firm* — Fenwick & West LLP (57) ABSTRACT

An organic light emitting diode display device comprises: first and second substrates facing and spaced apart from each other; a gate line and a data line on the first substrate, the gate line and the data line crossing each other to define a plurality of pixel regions; at least one thin film transistor coupled to the gate line and the data line; a light emitting diode coupled to the at least one thin film transistor, the light emitting diode including a first electrode, an emitting layer and a second electrode; and a passivation layer on the light emitting diode, the passivation layer having a smaller area than the second electrode.

12 Claims, 6 Drawing Sheets

ORGANIC LIGHT EMITTING DIODE DISPLAY DEVICE AND METHOD OF FABRICATING THE SAME

CROSS-REFERENCE TO RELATED APPLICATION

This application claims the benefit under 35 U.S.C. §119(a) of Korean Patent Application No. 10-2012-0146781, filed on Dec. 14, 2012, in the Korean Intellectual Property Office, which is incorporated herein by reference in its entirety.

BACKGROUND

1. Technical Field

The present disclosure relates to an organic light emitting diode (OLED) display device, and more particularly, to an OLED display device where a passivation layer has a smaller area than an upper electrode of a light emitting diode and a method of fabricating the OLED display device.

2. Discussion of the Related Art

Among various flat panel displays (FPDs), an organic light emitting diode (OLED) display device has superior properties such as high brightness and an ability to be driven by a low voltage. Since the OLED display device is an emissive type, the OLED display device has high contrast ratio and thin profile. The OLED display device has an advantage in displaying a moving image due to the low response time of several micro seconds (μsec). The OLED display device has no limitation on a viewing angle and is stable even in a low temperature. Since the OLED display device is driven by a low voltage of 5V to 15V in direct current (DC), it is easy to fabricate and design a driving circuit.

In addition, since a fabrication process of the OLED display device requires only a deposition apparatus and an encapsulating apparatus, the fabrication process of the OLED display device is simple.

The OLED display device includes a plurality of pixel regions, and a switching thin film transistor (TFT) and a driving TFT are formed in each of the plurality of pixel regions. Generally, the TFTs are formed by using a semiconductor material such as amorphous silicon.

Recently, to meet the requirements of large size and high resolution, the OLED display device including the TFTs having faster signal process, more stable operation and durability is required. However, the TFT using amorphous silicon has a relatively low mobility (e.g., less than 1 cm²/Vsec), which presents challenges in developing the OLED display device with large size and high resolution.

Accordingly, an oxide TFT including an active layer of an oxide semiconductor material, which has excellent electrical properties such as high mobility and low leakage current can be used to obviate some of these shortcomings.

Figure 1:
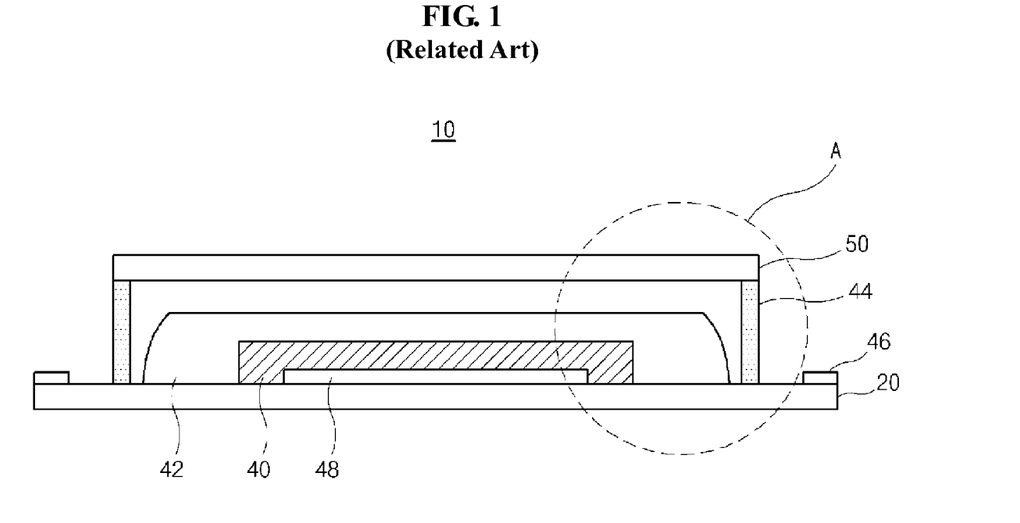
FIG. 1 is a cross-sectional view showing an organic light emitting diode display device according to the related art.
Figure 2:
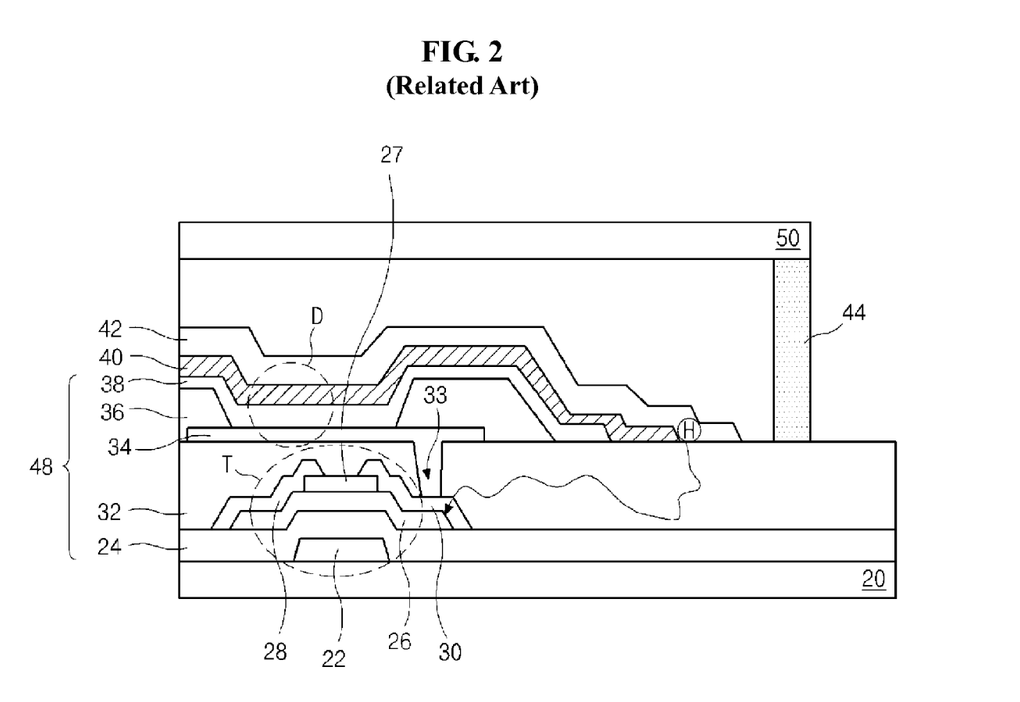
FIG. 2 is a magnified view of a portion A of FIG. 1.

Figure (FIG. 1) is a cross-sectional view showing an organic light emitting diode display device according to the related art, and FIG. 2 is a magnified view of a portion A of FIG. 1.

In FIGS. 1 and 2, an organic light emitting diode (OLED) display device 10 includes first and second substrates 20 and 50, an array layer 48, a second electrode 40 and a passivation layer 42 sequentially on the first substrate 20 and a seal pattern 44 at an edge portion between the first and second substrates 20 and 50.

The first and second substrates 20 and 50 facing and spaced apart from each other include a plurality of pixel regions (not shown). The array layer 48 includes a gate line (not shown), a data line (not shown), a power line (not shown), a switching thin film transistor (TFT), a driving TFT T, a first electrode 34 and an emitting layer 38. Also, the gate line, the data line and the power line cross each other to form the plurality of pixel regions. In addition, the switching TFT is coupled to the gate line and the data line. Moreover, the driving TFT T is coupled to the switching TFT, the power line, and the first electrode 34 is connected to the driving TFT T. Furthermore, the first electrode 34, the emitting layer 38 and the second electrode 40 constitute a light emitting diode (LED) D.

The array layer 48 is disposed in a display region at a central portion of the first and second substrates 20 and 50. A gate electrode 22 is formed in each pixel region on an inner surface of the first substrate 20, and a gate insulating layer 24 is formed on the gate electrode 22. Also, an oxide semiconductor layer 26 is formed on the gate insulating layer 24 corresponding to the gate electrode 22, and an etch stopper 27 is formed on the oxide semiconductor layer 26. In addition, source and drain electrodes 28 and 30 are formed on both end portions, respectively, of the etch stopper 27 and the oxide semiconductor layer 26. The gate electrode 22, the oxide semiconductor layer 26, the source electrode 28 and the drain electrode 30 constitute the driving TFT T.

A protecting layer 32 is formed on the driving TFT T. The protecting layer 32 includes a drain contact hole 33 exposing the drain electrode 30 of the driving TFT T.

The first electrode 34 coupled to the driving TFT T is formed on the protecting layer 32 in each of the plurality of pixel regions, and a bank layer 36 is formed on a boundary portion of the first electrode 34. The bank layer 36 includes an opening exposing a central portion of the first electrode 34. The emitting layer 38 contacting the first electrode 34 through the opening is formed on the bank layer 36, and the second electrode 40 is formed on the emitting layer 38. The first electrode 34, the emitting layer 38 and the second electrode 40 constitute the LED D. In addition, the passivation layer 42 is formed on the second electrode 40.

The seal pattern 44 attaches the first and second substrates 20 and 50, and a plurality of pads 46 coupled to a driving circuit (not shown) are formed on the first substrate 20 outside the seal pattern 44. The first substrate 20 is referred to as a lower substrate, a TFT substrate or a backplane, and the second substrate 50 is referred to as an encapsulation substrate.

In the OLED display device 10, each of the second electrode 40 where a common voltage is applied and the passivation layer 42 protecting the LED D from an exterior moisture or an exterior contaminant are formed as a single body covering the plurality of pixel regions. As a result, each of the second electrode 40 and the passivation layer 42 is formed on an entire surface of the first substrate 20.

The passivation layer 42 is formed by a plasma chemical vapor deposition (PCVD) apparatus or a physical vapor deposition (PVD) apparatus such as a sputter. In one exemplary embodiment, silicon nitride (SiNx) film, silicon oxynitride (SiON) film or silicon oxide (SiOx) film formed by the PCVD apparatus or alumina (AlOx) film formed by the sputter may be used as the passivation layer 42.

However, when the passivation layer 42 is formed of silicon compound by the PCVD apparatus, a deposition process should be performed under a relatively low temperature (e.g., less than about 100° C.) to prevent deterioration of the emitting layer 38. Due to the relatively low temperature, source gases do not completely react and hydrogen (H) from the source gases such as silane (SiH$_4$) gas or ammonia (NH$_3$) gas remains in the passivation layer 42.

The hydrogen is diffused into the oxide semiconductor layer 26 of the driving TFT T through the protecting layer 32 to generate a reduction process of the oxide semiconductor material of the oxide semiconductor layer 26. The reduction of the oxide semiconductor material due to the hydrogen results in a threshold voltage shift of the driving TFT T, and the threshold voltage shift causes deterioration such as a stain or brightness deviation in an image. As a result, a displaying quality of the OLED display device 10 is degraded.

SUMMARY

Embodiments of the present invention relate to an organic light emitting diode display device and a method of fabricating the organic light emitting diode display device. Accordingly, one exemplary embodiment is directed to an organic light emitting diode display device that substantially obviates one or more of the problems due to limitations and disadvantages of the related art.

One exemplary embodiment is an organic light emitting diode display device, where reduction of an oxide semiconductor material is prevented by an upper electrode having a larger area than a passivation layer, and a method of fabricating the organic light emitting diode display device.

In addition, one exemplary embodiment is an organic light emitting diode display device, where deterioration is prevented and display quality is improved by an upper electrode having a larger area than a passivation layer, and a method of fabricating the organic light emitting diode display device.

Advantages and features of the disclosure will be set forth in part in the description, which follows and in part will become apparent to those having ordinary skill in the art upon examination of the following or may be learned from practice of the invention. Other advantages and features of the embodiments herein may be realized and attained by the structure particularly pointed out in the written description and claims hereof as well as the appended drawings.

To achieve other advantages and features in accordance with the purpose according to one aspect of the invention, one exemplary embodiment is an organic light emitting diode display device comprising: first and second substrates facing and spaced apart from each other; a gate line and a data line on the first substrate, the gate line and the data line crossing each other to define a plurality of pixel regions; at least one thin film transistor coupled to the gate line and the data line; a light emitting diode coupled to the at least one thin film transistor, the light emitting diode including a first electrode, an emitting layer and a second electrode; and a passivation layer on the light emitting diode, and the passivation layer having a smaller area than the second electrode.

In another aspect, one exemplary embodiment is a method of fabricating an organic light emitting diode display device, comprising: forming a gate line and a data line on a first substrate, the gate line and the data line crossing each other to define a plurality of pixel regions; forming at least one thin film transistor coupled to the gate line and the data line; forming a light emitting diode coupled to the at least one thin film transistor, the light emitting diode including a first electrode, an emitting layer and a second electrode; forming a passivation layer on the light emitting diode, the passivation layer having a smaller area than the second electrode; and attaching a second substrate to the first substrate having the passivation layer.

It is to be understood that both the foregoing general description and the following detailed description are exemplary and explanatory, and are intended to provide further explanation of the invention as claimed.

BRIEF DESCRIPTION OF THE DRAWINGS

The accompanying drawings, which are included to provide a further understanding of the invention, are incorporated in and constitute a part of this specification, illustrate implementations of the invention and together with the description serve to explain the principles of the invention.

DETAILED DESCRIPTION

Reference will now be made in detail to embodiments of the present invention, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

Figure 3:
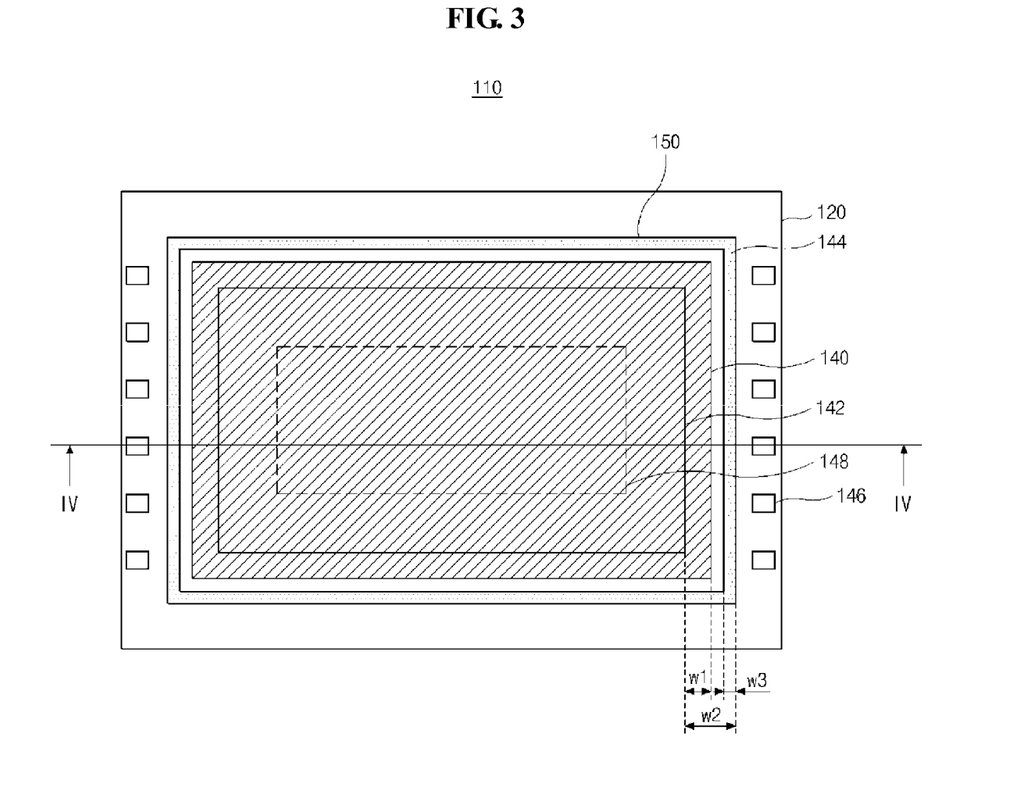
FIG. 3 is a plan view showing an organic light emitting diode display device according to a first embodiment of the present invention.
Figure 4:
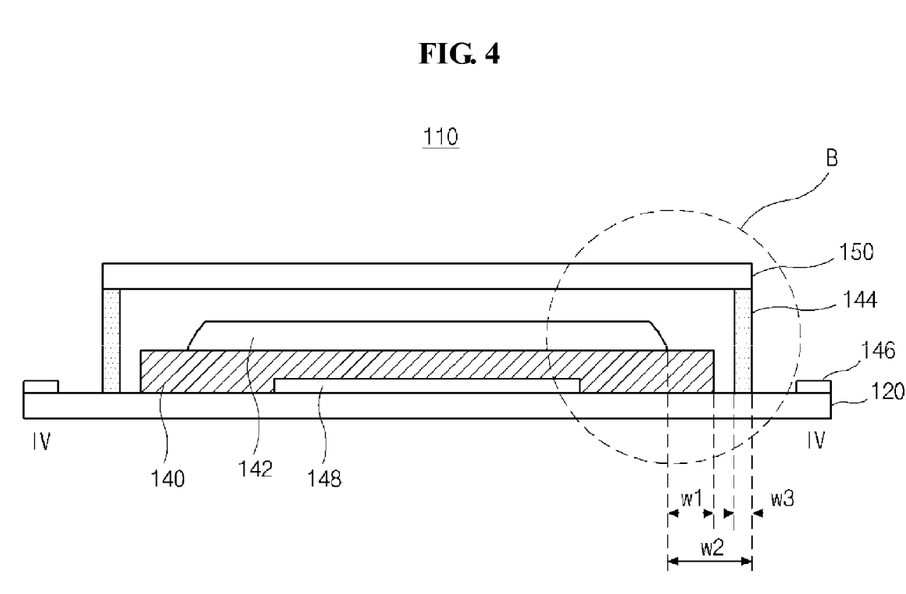
FIG. 4 is a cross-sectional view taken along a line IV-IV of FIG. 3.
Figure 5:
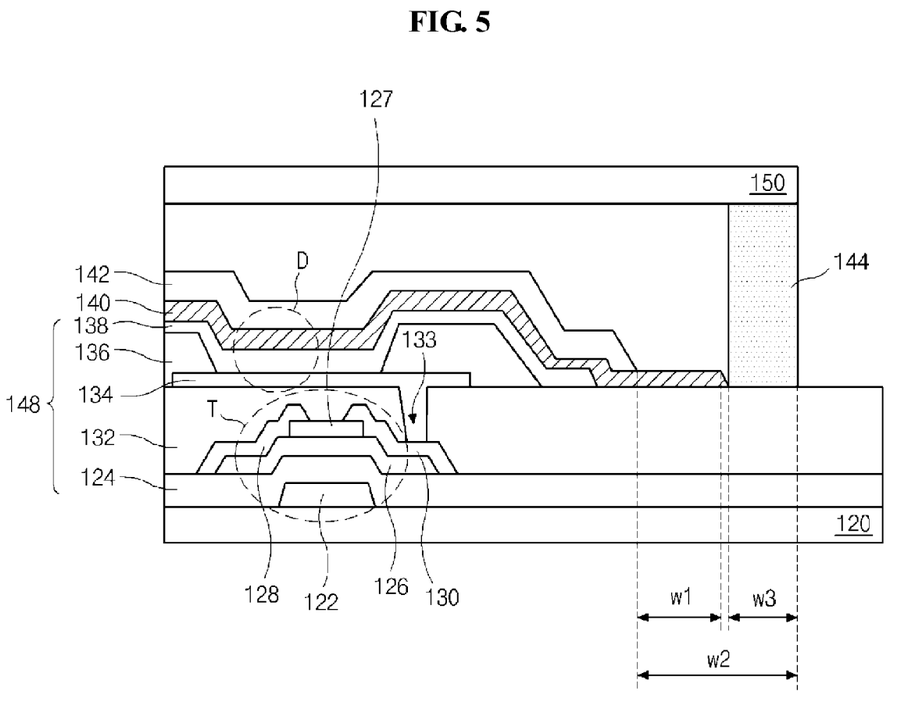
FIG. 5 is a magnified view of a portion B of FIG. 4.

FIG. 3 is a plan view showing an organic light emitting diode display device according to a first embodiment of the present invention, FIG. 4 is a cross-sectional view taken along a line IV-IV of FIG. 3, and FIG. 5 is a magnified view of a portion B of FIG. 4.

In FIG. 3, FIG. 4 and FIG. 5, an organic light emitting diode (OLED) display device 110 includes first and second substrates 120 and 150, an array layer 148, a second electrode 140 and a passivation layer 142 sequentially on the first substrate 120 and a seal pattern 144 in an edge portion between the first and second substrates 120 and 150.

The first and second substrates 120 and 150 facing and spaced apart from each other include a plurality of pixel regions (not shown). The array layer 148 includes a gate line (not shown), a data line (not shown), a power line (not shown), a switching thin film transistor (TFT), a driving TFT T, a first electrode 134 and an emitting layer 138. In addition, the gate line, the data line and the power line cross each other to form the plurality of pixel regions. Also, the switching TFT is coupled to the gate line and the data line, and the driving TFT T is coupled to the switching TFT and the power line. The first electrode 134 is connected to the driving TFT T. Furthermore, the first electrode 134, the emitting layer 138 and the second electrode 140 constitute a light emitting diode (LED) D.

The array layer 148 is disposed in a display region at a central portion of the first and second substrates 120 and 150, and emits light for displaying an image. A gate electrode 122 is formed in each pixel region on an inner surface of the first substrate 120 and a gate insulating layer 124 is formed on the gate electrode 122. An oxide semiconductor layer 126 is formed on the gate insulating layer 124 corresponding to the gate electrode 122, and an etch stopper 127 is formed on the oxide semiconductor layer 126.

Source and drain electrodes 128 and 130 are formed on the etch stopper 127. The source and drain electrodes 128 and 130 contact both end portions, respectively, of the oxide semiconductor layer 126. The gate electrode 122, the oxide semiconductor layer 126, the source electrode 128 and the drain electrode 130 constitute the driving TFT T.

The oxide semiconductor layer 126 may include an oxide semiconductor material such as indium gallium zinc oxide (IGZO), zinc indium oxide (ZIO), zinc gallium oxide (ZGO) and zinc tin oxide (ZTO). As a result, the driving TFT T may have excellent electrical properties such as a relatively high mobility, a relatively low leakage current and a relatively constant static current.

A protecting layer 132 is formed on the driving TFT T. The protecting layer 132 includes a drain contact hole 133 exposing the drain electrode 130 of the driving TFT T.

The first electrode 134 is formed on the protecting layer 132 in each of the plurality of pixel regions, and a bank layer 136 is formed on a boundary portion of the first electrode 134. The first electrode 134 is electrically coupled to the drain electrode 130 of the driving TFT T though the drain contact hole 133. The bank layer 136 includes an opening, exposing a central portion of the first electrode 134.

The emitting layer 138 contacting the first electrode 134 through the opening is formed on the bank layer 136, and the second electrode 140 is formed on the emitting layer 138. The first electrode 134, the emitting layer 138 and the second electrode 140 constitute the LED D. In addition, the passivation layer 142 is formed on the second electrode 140.

The seal pattern 144 attaches the first and second substrates 120 and 150, and a plurality of pads 146 coupled to a driving circuit (not shown) are formed on the first substrate 120 outside the seal pattern 144. The first substrate 120 is referred to as a lower substrate, a TFT substrate or a backplane, and the second substrate 150 is referred to as an encapsulation substrate.

In the OLED display device 110, each of the second electrode 140 where a common voltage is applied, and the passivation layer 142 protecting the LED D from exterior moisture or an exterior contaminant, are formed as a single body covering the plurality of pixel regions. As a result, each of the second electrode 140 and the passivation layer 142 is formed on an entire surface of the first substrate 120. In addition, the second electrode 140 is formed to have a larger area than the passivation layer 142, such that the passivation layer 142 is formed only on the second electrode 140. Accordingly, the passivation layer 142 is formed inside a boundary of the second electrode 140.

For example, when each of the second electrode 140 and the passivation layer 142 is formed to have a rectangular shape, four sides of the second electrode 140 may be exposed outside the passivation layer 142 and the seal pattern 144 may be formed in a region between the boundary of the second electrode 140 and the boundary of the second substrate 140.

When the second electrode 140 is formed to exceed the seal pattern 144 and have a larger area than the second substrate 150, the second electrode 140 may be corroded by moisture or a contaminant. In addition, the second electrode 140 may be peeled off from the first substrate 120, and the moisture or the contaminant may penetrate into the emitting layer 138 through an interface between the peeled second electrode 140 and the first substrate 120.

For the purpose of preventing the corrosion of the second electrode 140, the second electrode 140 is formed inside the boundary of the second substrate 140. For example, a first rectangular ring shape of the second electrode 140 exposed outside the passivation layer 142 may have a first width w1, a second rectangular ring shape between the boundary of the passivation layer 142 and the boundary of the second substrate 150 may have a second width w2, and a third rectangular ring shape of the seal pattern 144 may have a third width w3. The first width w1 may be smaller than the second width w2 (w1<w2), and the third width w3 may be equal to or smaller than a value of the first width w1 subtracted from the second widths w2 (w3≤(w2−w1)).

Accordingly, diffusion of remaining hydrogen of the passivation layer 142 is blocked by the second electrode 140 and reduction of the oxide semiconductor layer 126 of the driving TFT T is prevented, thereby a threshold voltage shift of the driving TFT T prevented.

For the purpose of preventing diffusion of hydrogen by the second electrode 140, the second electrode 140 may include a material having a relatively low permeability of hydrogen, the second electrode 140 may include one of aluminum (Al), copper (Cu), silver (Ag), gold (Au) and platinum (Pt).

In addition, each of the second electrode 140 and the passivation layer 142 may be formed by using a shadow mask. For example, the second electrode 140 may be formed through an evaporation method or a physical vapor deposition (PVD) method. After a first shadow mask having a first open area is disposed over the emitting layer 138 on the first substrate 120, a metallic material may be deposited through the first open area of the first shadow mask to form the second electrode 140 on the emitting layer 138. Further, the passivation layer 142 may be formed through a chemical vapor deposition (CVD) method. After a second shadow mask having a second open area smaller than the first open area is disposed over the second electrode 140 on the first substrate 120, an insulating material may be deposited through the second open area of the second shadow mask to form the passivation layer 142 on the second electrode 140.

The second electrode 140 formed through an evaporation method may have a relatively weak adhesion to the first substrate 120. For the purpose of obtaining reliability of adhesion between the first and second substrates 120 and 150, the seal pattern 144 may be formed to contact the first and second substrates 120 and 150 directly and have a width equal to or greater than a reference value. For example, the seal pattern 144 may have the third width w3 equal to or greater than about 0.05% of a diagonal length of the second substrate 150.

Another embodiment where the first and second substrates are attached to each other with a sealant wholly formed between the first and second substrates instead of the seal pattern 144 will be illustrated with reference to drawings hereinafter.

Figure 6:
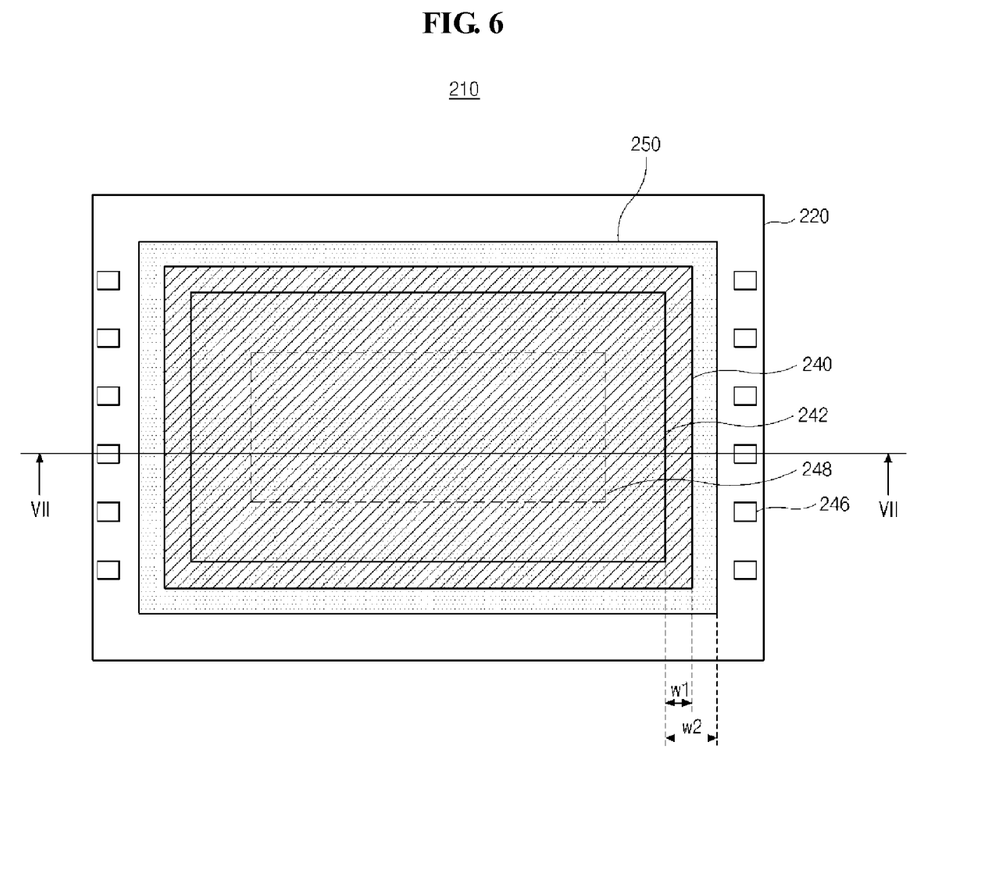
FIG. 6 is a plan view showing an organic light emitting diode display device according to a second embodiment of the present invention.
Figure 7:
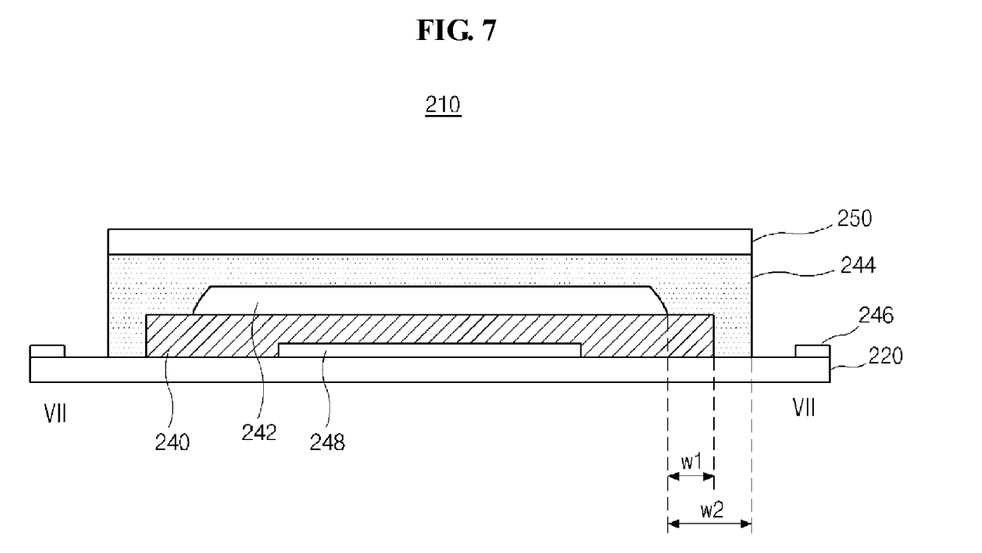
FIG. 7 is a cross-sectional view taken along a line VII-VII of FIG. 6.

FIG. 6 is a view showing an organic light emitting diode display device according to a second embodiment of the present invention, FIG. 7 is a cross-sectional view taken along a line VII-VII of FIG. 6.

In FIGS. 6 and 7, an organic light emitting diode (OLED) display device 210 includes first and second substrates 220 and 250, an array layer 248, a second electrode 240 and a passivation layer 242 sequentially on the first substrate 220 and a sealant 244 in an entire area between the first and second substrates 220 and 250.

The first and second substrates 220 and 250 facing and spaced apart from each other include a plurality of pixel regions (not shown). Although not shown, the array layer 248 includes a gate line, a data line, a power line, a switching thin film transistor (TFT), a driving TFT, a first electrode and an emitting layer. The gate line, the data line and the power line cross each other to define the plurality of pixel regions. The switching TFT is coupled to the gate line and the data line, and the driving TFT is coupled to the switching TFT and the power line. The first electrode is coupled to the driving TFT, and the first electrode, the emitting layer and the second electrode 240 constitute a light emitting diode (LED).

Similarly to the first embodiment, the array layer 248 of the second embodiment is disposed in a display region at a central portion of the first and second substrates 220 and 250 and emits light for displaying an image. Although not shown, a gate electrode is formed in each pixel region on an inner surface of the first substrate 220 and a gate insulating layer is formed on the gate electrode. An oxide semiconductor layer is formed on the gate insulating layer corresponding to the gate electrode, and an etch stopper is formed on the oxide semiconductor layer.

Source and drain electrodes are formed on the etch stopper. The source and drain electrodes contact both end portions, respectively, of the oxide semiconductor layer. The gate electrode, the oxide semiconductor layer, the source electrode and the drain electrode constitute the driving TFT.

The oxide semiconductor layer may include an oxide semiconductor material such as indium gallium zinc oxide (IGZO), zinc indium oxide (ZIO), zinc gallium oxide (ZGO) and zinc tin oxide (ZTO). As a result, the driving TFT T may have excellent electrical properties such as a relatively high mobility, a relatively low leakage current and a relatively constant static current.

A protecting layer is formed on the driving TFT. The protecting layer includes a drain contact hole exposing the drain electrode of the driving TFT.

The first electrode is formed on the protecting layer in each of the plurality of pixel regions, and a bank layer is formed on a boundary portion of the first electrode. The first electrode is electrically coupled to the drain electrode of the driving TFT though the drain contact hole. The bank layer includes an opening exposing a central portion of the first electrode.

The emitting layer contacting the first electrode through the opening is formed on the bank layer, and the second electrode 240 is formed on the emitting layer. The first electrode, the emitting layer and the second electrode 240 constitute the LED D. In addition, the passivation layer 242 is formed on the second electrode 240.

The sealant 244, which is referred to as a face seal, may be formed in an entire area between the first and second substrates 220 and 250. The sealant 244 attaches the first and second substrates 220 and 250, and a plurality of pads 246 coupled to a driving circuit (not shown) are formed on the first substrate 220 outside the sealant 244. In addition, the sealant 244 may prevent permeation of an exterior moisture or an exterior contaminant and may absorb an exterior impact. The first substrate 220 is referred to as a lower substrate, a TFT substrate or a backplane, and the second substrate 250 is referred to as an encapsulation substrate.

In the OLED display device 210, each of the second electrode 240 where a common voltage is applied and the passivation layer 242 protecting the LED from an exterior moisture or an exterior contaminant are formed as a single body covering the plurality of pixel regions. As a result, each of the second electrode 240 and the passivation layer 242 is formed on an entire surface of the first substrate 220. In addition, the second electrode 240 is formed to have a larger area than the passivation layer 242 such that the passivation layer 242 is formed only on the second electrode 240. Accordingly, the passivation layer 242 is formed inside a boundary of the second electrode 240.

When each of the second electrode 240 and the passivation layer 242 is formed to have a rectangular shape, four sides of the second electrode 240 may be exposed outside the passivation layer 242.

When the second electrode 240 is formed to exceed the sealant 244 and have a larger area than the second substrate 250, the second electrode 240 may be corroded by a moisture or a contaminant. In addition, the second electrode 240 may be peeled off from the first substrate 220, and the moisture or the contaminant may penetrate into the emitting layer through an interface between the peeled second electrode 240 and the first substrate 220.

For the purpose of preventing corrosion of the second electrode 240, the second electrode 240 is formed inside the boundary of the second substrate 240. For example, a first rectangular ring shape of the second electrode 240 exposed outside the passivation layer 242 may have a first width w1 and a second rectangular ring shape between the boundary of the passivation layer 242 and the boundary of the second substrate 150 may have a second width w2. The first width w1 may be smaller than the second width w2 (w1<w2).

Accordingly, diffusion of remaining hydrogen of the passivation layer 242 is blocked by the second electrode 240, preventing reduction of the oxide semiconductor layer of the driving TFT, and further preventing a threshold voltage shift of the driving TFT.

For the purpose of preventing diffusion of hydrogen by the second electrode 240, the second electrode 240 may include a material having a relatively low permeability of hydrogen. For example, the second electrode 240 may include one of aluminum (Al), copper (Cu), silver (Ag), gold (Au) and platinum (Pt).

In addition, each of the second electrode 240 and the passivation layer 242 may be formed by using a shadow mask. For example, the second electrode 240 may be formed through an evaporation method or a physical vapor deposition (PVD) method. After a first shadow mask having a first open area is disposed over the emitting layer on the first substrate 220, a metallic material may be deposited through the first open area of the first shadow mask to form the second electrode 240 on the emitting layer. Further, the passivation layer 242 may be formed through a chemical vapor deposition (CVD) method. After a second shadow mask having a second open area smaller than the first open area is disposed over the second electrode 240 on the first substrate 220, an insulating material may be deposited through the second open area of the second shadow mask to form the passivation layer 242 on the second electrode 240.

Consequently, in an exemplary embodiment of the OLED display device, the passivation layer is formed to have a smaller area than the second electrode, therefore the diffusion of hydrogen remaining in the passivation layer is blocked by the second electrode. As a result, the reduction of the semiconductor material of the TFTs and the threshold voltage shift of the TFTs are prevented. In addition, deterioration such as stain or brightness deviation in an image is prevented and display quality of the OLED display device is improved.

It will be apparent to those skilled in the art that various modifications and variations can be made in embodiments of the present invention without departing from the spirit or scope of the invention. Thus, it is intended that the present invention cover the modifications and variations of this invention provided they come within the scope of the appended claims and their equivalents.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An organic light emitting diode display device comprising:
   first and second substrates facing and spaced apart from each other;
   a gate line and a data line on the first substrate, the gate line and the data line crossing each other to define a plurality of pixel regions;
   at least one thin film transistor coupled to the gate line and the data line;
   a light emitting diode coupled to the at least one thin film transistor, the light emitting diode including a first electrode, an emitting layer and a second electrode; and
   a passivation layer on the light emitting diode, the passivation layer having a smaller area than the second electrode,
   wherein the passivation layer and the emitting layer are disposed to face each other with the second electrode therebetween.

2. The device of claim 1, wherein each of the second electrode and the passivation layer is formed as a single body covering the plurality of pixel regions.

3. The device of claim 2, wherein the passivation layer is formed on the second electrode, and the second electrode is exposed outside the passivation layer.

4. The device of claim 3, wherein a first rectangular ring shape of the second electrode exposed outside the passivation layer has a first width, and a second rectangular ring shape between a boundary of the passivation layer and a boundary of the second substrate has a second width greater than the first width.

5. The device of claim 4, further comprising a seal pattern in an edge portion between the first and second substrates and attaching the first and second substrates to each other.

6. The device of claim 5, wherein a third rectangular ring shape of the seal pattern has a third width not greater than a value of the first width subtracted from the second width.

7. The device of claim 6, wherein the third width is not smaller than about 0.05% of a diagonal length of the second substrate.

8. The device of claim 4, further comprising a sealant in an entire area between the first and second substrates and attaching the first and second substrates to each other.

9. The device of claim 1, wherein the second electrode includes one of aluminum (Al), copper (Cu), silver (Ag), gold (Au) and platinum (Pt).

10. The device of claim 1, wherein the at least one thin film transistor includes an oxide semiconductor layer including one of indium gallium zinc oxide (IGZO), zinc indium oxide (ZIO), zinc gallium oxide (ZGO) and zinc tin oxide (ZTO).

11. The device of claim 1, further comprising a bank layer on the first electrode, wherein the bank layer includes an opening exposing the first electrode, wherein the emitting layer is disposed on the bank layer and contacts the first electrode through the opening, and wherein the second electrode is disposed on the emitting layer.

12. The device of claim 1, wherein the passivation layer is disposed inside a boundary of the second electrode.

* * * * *